United States Patent [19]

Nishiura et al.

[11] Patent Number: 4,659,920

[45] Date of Patent: Apr. 21, 1987

[54] IMAGE SENSOR ARRAYS WITH SERIES REDUNDANCY

[75] Inventors: Masaharu Nishiura, Yokosuka; Shinichiro Nagakusa, Nagano, both of Japan

[73] Assignee: Fuji Electric Company, Ltd., Kawasaki, Japan

[21] Appl. No.: 706,409

[22] Filed: Feb. 28, 1985

[30] Foreign Application Priority Data

Aug. 25, 1984 [JP] Japan ............................ 59-177089

[51] Int. Cl.$^4$ ............................................ H01J 40/14
[52] U.S. Cl. .............................. 250/211 J; 250/578
[58] Field of Search ............... 371/10, 11; 250/211 R, 250/211 J, 578, 208, 209; 358/212, 213; 324/158 D; 357/30, 31, 32

[56] References Cited

U.S. PATENT DOCUMENTS

| | | | |
|---|---|---|---|
| 4,463,649 | 8/1984 | Tokushima | 250/578 |
| 4,563,590 | 1/1986 | Gillessen et al. | 250/578 |
| 4,567,529 | 1/1986 | Yamaguchi et al. | 250/578 |

FOREIGN PATENT DOCUMENTS

82/03146  9/1982  PCT Int'l Appl. .

*Primary Examiner*—David C. Nelms
*Attorney, Agent, or Firm*—Brumbaugh, Graves, Donohue & Raymond

[57] ABSTRACT

In the particular embodiments of the invention disclosed in the specification, a closely spaced sensor array has two or three adjacent rows of sensor elements arranged to be connected so that if there is a defective sensor element in one row, an output signal can be obtained from the corresponding sensor element in an adjacent row to be used in place of a signal from the defective element. In one embodiment this is accomplished by selective operation of a switch and, in other embodiments, the signal output lead from the defective element is severed from that element and connected to the corresponding element in the adjacent row.

3 Claims, 18 Drawing Figures

IMAGE SENSOR ARRAYS WITH SERIES REDUNDANCY

BACKGROUND OF THE INVENTION

This invention relates to closely spaced image sensor arrays and, more partioularly, to such image sensor arrays arranged to read images of documents and the like.

Document reproduction and transmissions systems using closely spaced photo sensor arrays to read document characters require an array of about 2000 sensors, each of which must be fully operative in order to reproduce an image of good quality. Heretofore such sensor arrays have had the disadvantage that if one sensor of the array was defective, the entire array had to be replaced.

Accordingly, it is an object of this invention to provide a closely spaced image sensor array containing a large number of photosensors which may be used even if one or more sensors in the array is defective.

SUMMARY OF THE INVENTION

In accordance with the invention a closely spaced sensor array includes a plurality of adjacent rows of sensor elements, each row containing a series of elements arranged in a line, each of the elements in each row corresponding to an element in each of the other rows, and a circuit arranged to supply an output signal from a selected one of the sensor elements in one row in parallel with output signals from other sensor elements in an adjacent row. Consequently, if there is a defective element in any of the rows of sensor elements, an output signal can be obtained from one of the corresponding sensor elements in the other rows. This may be accomplished by a selective switch or by disconnection of a defective element from a common terminal for all corresponding sensor elements.

BRIEF DESCRIPTION OF THE DRAWINGS

Further objects and advantages of the invention will be apparent from a reading of the following description in conjunction with the accompanying drawings in which.

DESCRIPTION OF PREFERRED EMBODIMENTS

Figures 7, 8:
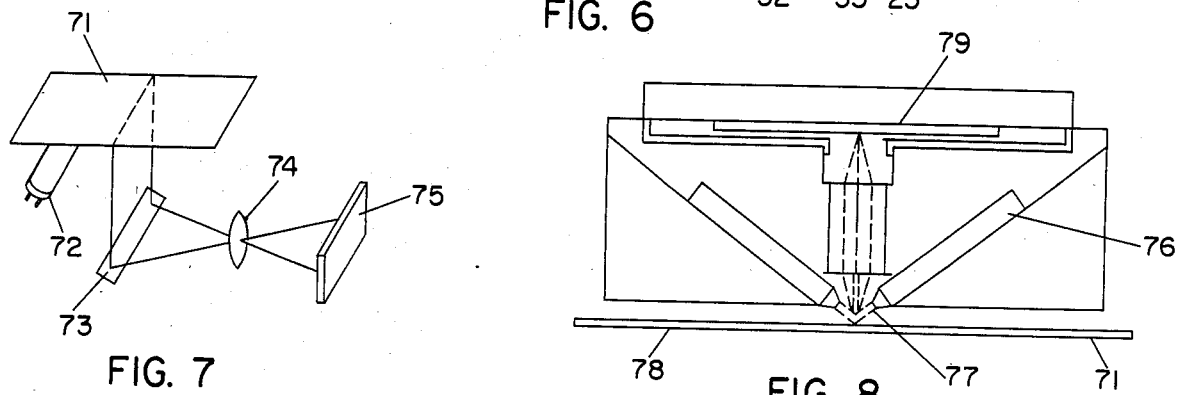
FIG. 7 is a perspective view schematically illustrating the document reading portion of a facsimile device which does not use a closely spaced image sensor array.
FIG. 8 is a sectional view of the document reading portion of a facsimile device which uses a closely spaced image sensor array.

Referring first to FIG. 7, a facsimile device operates by irradiating a document 71 with light from a light source such as a fluorescent lamp 72. An image of the document is projected in a reduced size by a mirror 73 and a lens 74, etc. to a charge-coupled device (CCD) sensor 75. With this arrangement, however, the facsimile system must be relatively large because the distance between the document 71 and the sensor 75 is large. In addition, a fine adjustment is required for the optical system. These factors increase the cost of the system.

With the development of sensor arrays which extend the full width of a document, it has become possible for a sensor array to correspond on a 1:1 basis with the document. FIG. 8 shows a document reading part of a facsimile device using such an array. In this case, a document 71 is irradiated with a line of light 77 emitted from a light emitting diode array 76 and full size images of linear segments of the document are projected in succession to an image sensor array 79 through a linear imaging lens 78 as the document moves past the lens. Since the sensor array has a large number of sensing units arranged to receive images of adjacent signal elements of the document, it is called a closely spaced array. Output signals from the sensor array 79 are processed by a computer to provide an image signal. Such image sensor arrays do not require a sophisticated optical system. Moreover, they can be adjusted easily and they decrease the distance between document and sensor array, reducing the cost of the system.

Figure 9:
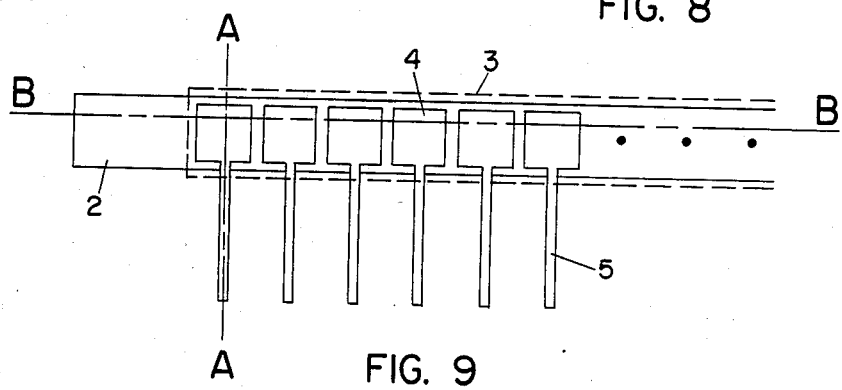
FIG. 9 is a plan view showing a conventional closely spaced image sensor array.
Figures 9A, 9B:
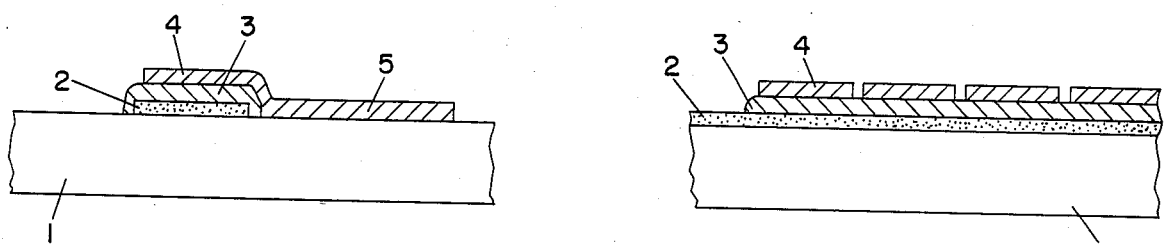
FIG. 9A is a sectional view of the array shown in FIG..9, taken along the A—A.
FIG. 9B is a sectional view of the array shown in FIG. 9, taken along the, line B—B.

FIGS. 9–9B show the arrangment of a typical closely spaced sensor array. This image sensor array is formed on one surface of a glass substrate 1 and image light is received from the opposite side of the substrate. On the substrate 1, a transparent electrode 2 is formed of ITO (indium-tin oxide) or $SnO_2$ (tin oxide) or a film containing layers of both those materials. The electrode 2 is deposited in the form of a strip by vacuum deposition through a strip-shaped mask or by a photo-etching technique which removes all of the deposited electrode material except for the strip 2. A row of closely spaced sensors is then formed on the electrode 2. The sensor array consists of a sensing strip 3 and a series of adjacent electrodes 4 formed on the sensing strip. The sensing strip 3 is an amorphous silicon (a-Si) layer which extends along the entire row of sensor elements as is apparent from FIG. 9. The a-Si layer is deposited by glow discharge decomposition of silane gas, and the strip shape of the a-Si layer can be formed by photoetching. A series of closely spaced metal electrodes 4 having electrical signal conducting leads 5 is then formed on the surface of the a-Si layer. Typical closely spaced sensor arrays of this type have about eight photo sensor units per millimeter. Consequently, a row of 1728 sensor units can be used to reproduce a document on paper having a width of 21.6 cm such as A4 size paper.

Figures 10A, 10B, 10C:
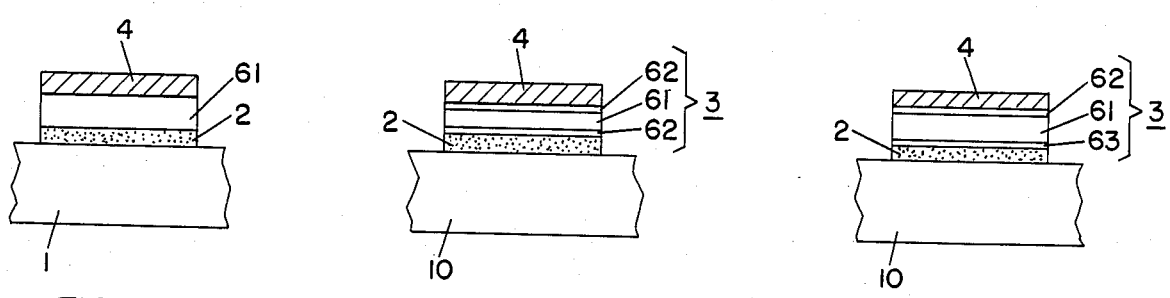
FIGS. 10A, 10B and 10C are sectional views illustrating three different types of sensor elements.

FIGS. 10A-10C show three representative types of a-Si layers for the sensing element of a closely spaced image sensor array. In FIG. 10A, a transparent electrode 2, a non-doped a-Si sensing layer 61 having a thickness of about 1 μm, and a metal electrode 4 are deposited in succession on a glass substrate 1. This non-doped a-Si layer 61 is formed by glow discharge decomposition of silane gas. In FIG. 10B, an n-type a-Si sensing layer 62 is formed with a thickness of about 100 Å, a non-doped a-Si layer of 61 with a thickness of about 0.5 μm is then deposited on the layer 61, and then an n-type a-Si layer 62 having a thickness of about 500 Å is deposited on the layer 61. In FIG. 10C, a p-type a-Si layer 63 with a thickness of about 100 Å is formed as the sensing layer 3, a non-doped a-Si layer 61 having a thickness of about 0.5 μm is deposited on the layer 63 and an n-type a-Si layer 62 with a thickness of about 500 Å is then deposited on the layer 61. FIGS. 10A and 10C show photovoltaic types of sensors and FIG. 10B shows a photoconductive type of sensor. A reverse bias is usually applied even to sensors of the photovoltaic type. When a closely spaced sensor array of the type shown in FIGS. 9-9B is used for facsimile, for example, all of the 1728 elements in the row must be operative. With such a large number of sensor elements, it is difficult to provide arrays on a consistent basis in which all of the elements are operative.

Figure 1:
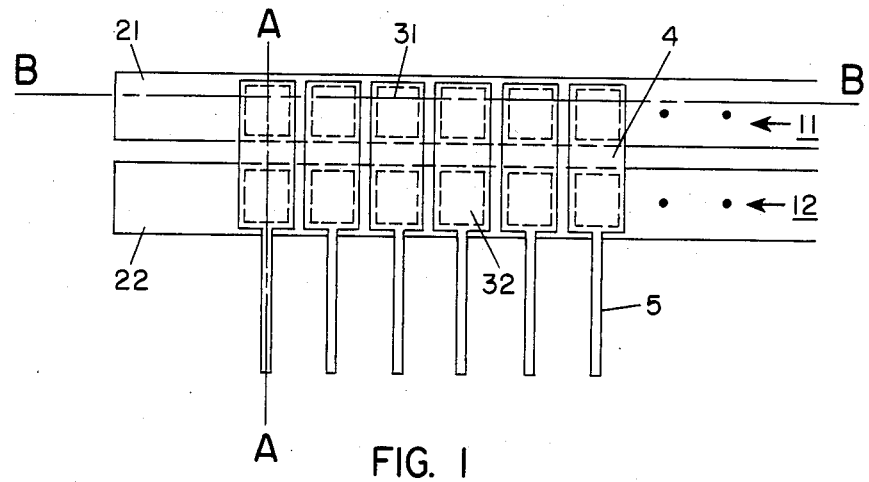
FIG. 1 is a fragmentary plan view illustrating a representative closely spaced image sensor array according to the invention.
Figure 1A:
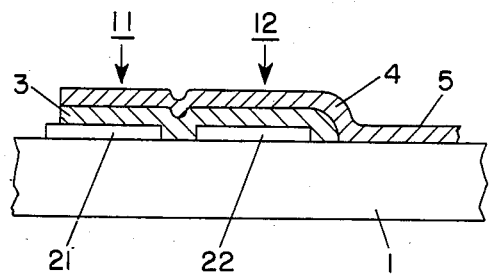
FIG. 1A is a sectional view of the image sensor array of FIG. 1, taken along the line A—A.
Figure 1B:
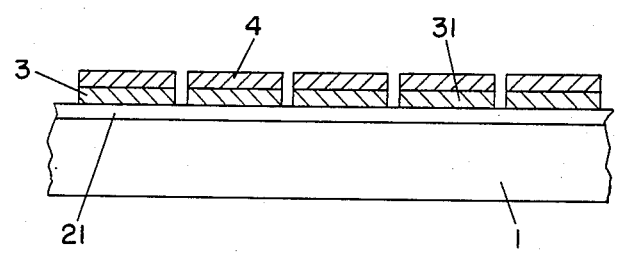
FIG. 1B is a sectional view of the image sensor of FIG. 1, taken along the line B—B.

In the representative embodiment of the invention shown in FIGS. 1, 1A and 1B, two spaced parallel rectangular-shaped transparent electrodes 21 and 22 are formed on a glass substrate 1 and a sensing element 3 and closely spaced metal electrodes 4 are deposited in succession on both electrodes 21 and 22 in the same manner described in connection with FIG. 9. Two rows 11 and 12 of closely spaced sensor elements are thus formed on the electrodes 21 and 22 respectively. For A4 size sheets, the sensor rows 11 and 12 each contain 1728 sensor units. Each metal electrode 4 is deposited on both rows 11 and 12 and has a single electrical signal output lead 5. The output lead is thus common to two adjacent sensor elements in the rows 11 and 12.

Accordingly, an output signal from a sensor unit in the row 11 can be obtained from the transparent electrode 21 and the corresponding metal electrode 4 while an output signal from the adjacent sensor unit in row 12 can be extracted from the transparent electrode 22 and adjacent metal electrode 4 in that row. If a sensor element using the sensing part 31 belonging to the sensor row 11, for example, is found to be defective, as a result of a test of all of the sensor elements, the sensor element 32 in the sensor row 12 can be used to provide the same signal.

Figure 2:
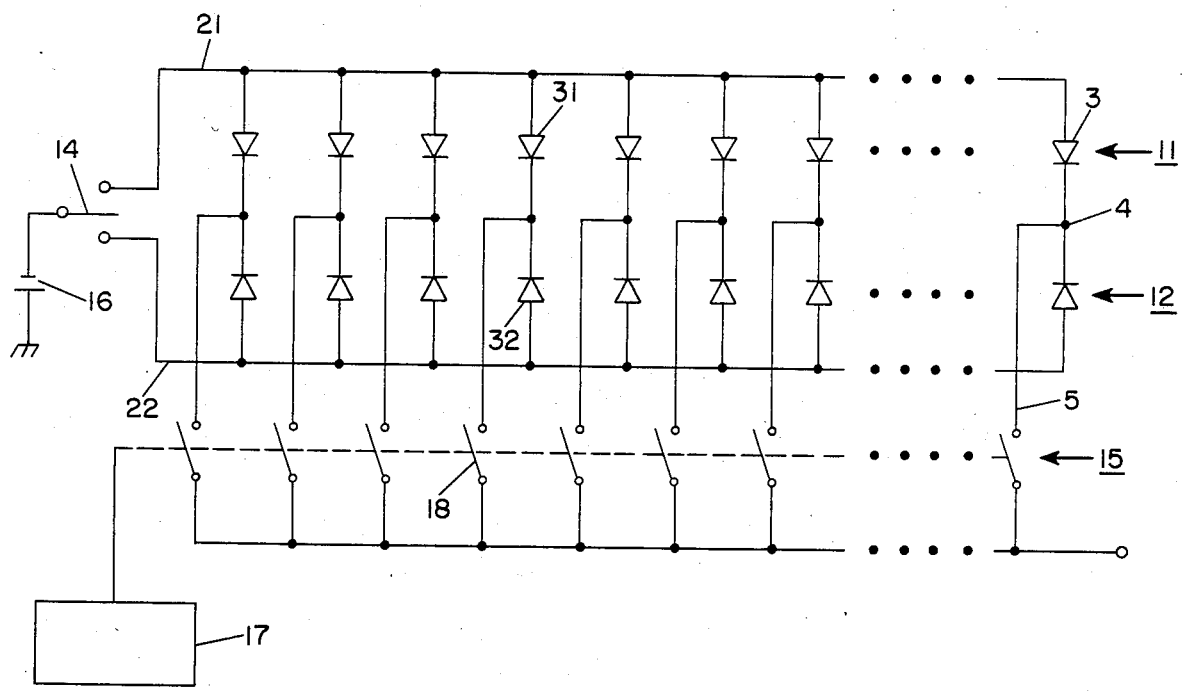
FIG. 2 is a schematic circuit diagram showing the equivalent circuit of the image sensor array shown in FIGS. 1–1B.

FIG. 2 shows an equivalent circuit for this image sensor array using a photovoltaic type of sensing element. In FIG. 2 the elements which are the same as those in FIG. 31 have the same reference numbers. A double pole switch 14 and a gang switch 15 are operated by a control unit (not shown) all of the sensing elements and, when the switch 14 is set to the position a, a voltage is applied to the sensing elements 3 from a DC power supply 16, and all switches 15 except for the switch 18 corresponding to the sensing element 31 are closed. As a result, output signals are obtained from all of the sensor elements in the row 11 except the element 31. When the light from the same part of the document moves to the sensor row 12, the switch 14 is moved to the position b and the switch 18 corresponding to the sensing element 32 is closed to obtain a signal corresponding to the signal which would have been produced by the element 31. Consequently, the signal for the portion of the document corresponding to sensing element 31 is supplied to an output from the element 32 in place of the data which could not be supplied by the image sensing element 31 and a complete image signal can thus be formed. In this way, a document can be read without lowering the readout speed.

Figure 3:
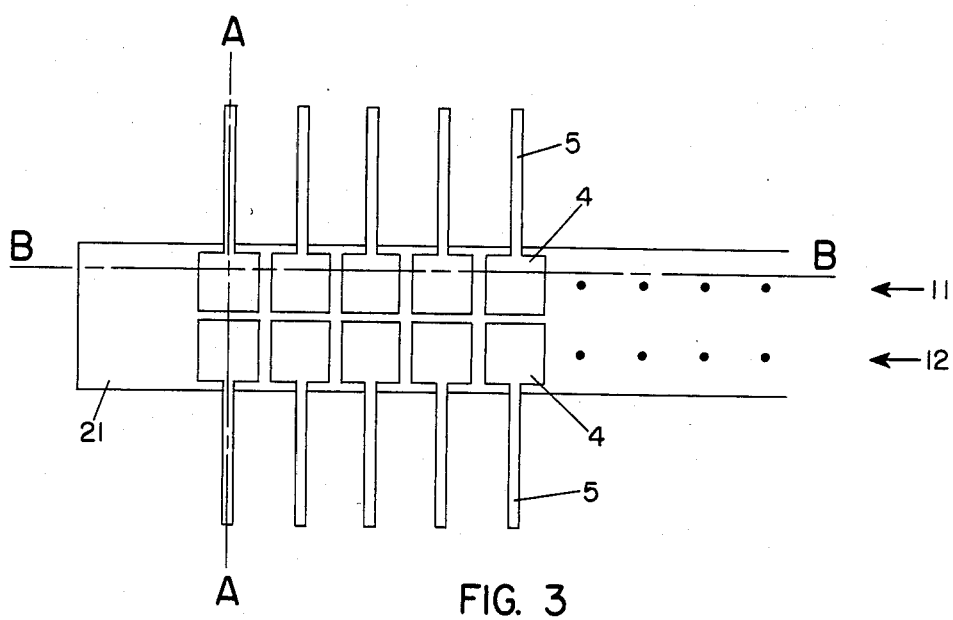
FIG. 3 is a fragmentary plan view illustrating another embodiment of the invention.
Figure 3A:
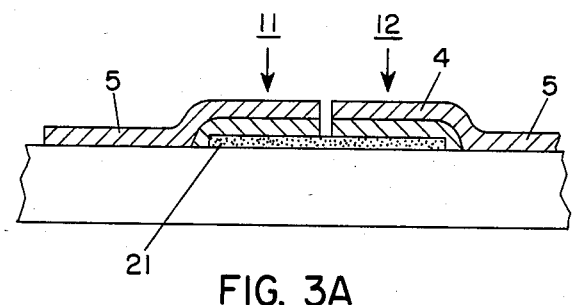
FIG. 3A is a sectional view of the embodiment shown in FIG. 3, taken along the line A'A.
Figure 3B:
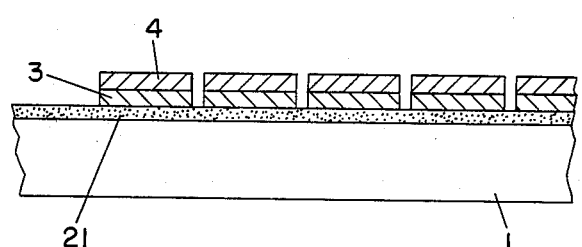
FIG. 3B is a sectional view of the embodiment shown in FIG. 3, taken along the line B—B.
Figure 4:
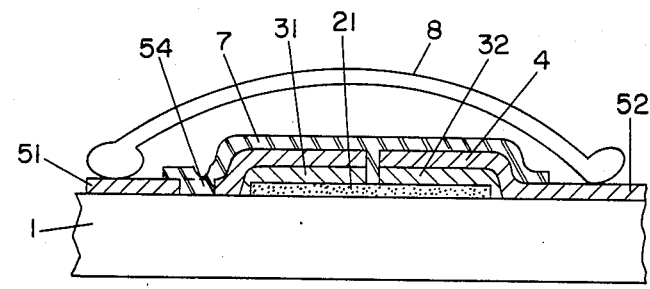
FIG. 4 is a fragmentary sectional view of the image sensor array shown in FIGS. 3–3B in the finished condition.

In the additional embodiment of the invention showing in FIGS. 3, 3A, 3B, and FIG. 4, two sensor rows 11 and 12 are formed on one common transparent electrode 21. A separate electrode 4 having an electrical signal lead 5 is provided for each sensor element. If a sensor element 31 in the row 11 of FIG. 3 is found to be defective the signal output lead 51 connected to the sensing element 31 is cut by a laser cutter at the position 54 shown in FIG. 4. As the laser source, a YAG laser with a beam diameter of several hundred μm and an output of several watts may be used. The severed region is then covered with an insulating film 7. The film 7 may be made of $Si_3N_4$ using silane, $CH_3$ and $NH_3$ or of $SiO_2$ using silane, $CH_4$ and $O_2$, using a plasma CVD technique. After the film has been deposited, selected areas may be removed by photo etching. The insulating film 7 can also be applied by printing methods.

Thereafter, the signal output lead 51 beyond the severed region 54 and the signal output lead 52 connected to the sensing element 32 belonging to the row of sensor elements 12 are connected by a lead wire 8. As a result, when the light reflected from a document reaches the row of sensor element 11, output signals are transmitted by all the elements other than the sensing element 31 and when the light enters the row of sensor element 12, an output signal is transmitted by the sensing element 32 through the output lead 52, the lead wire 8, and the output lead 51, and it is combined with the data obtained from the row of sensor elements 11 to provide an image signal.

Figure 5:
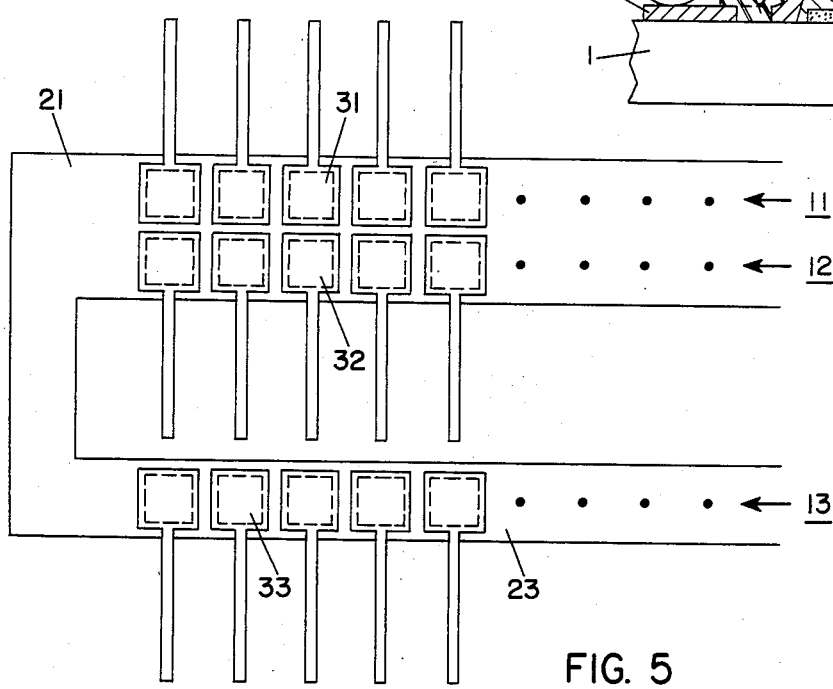
FIG. 5 is a fragmentary plan view showing another embodiment of the invention.
Figure 6:
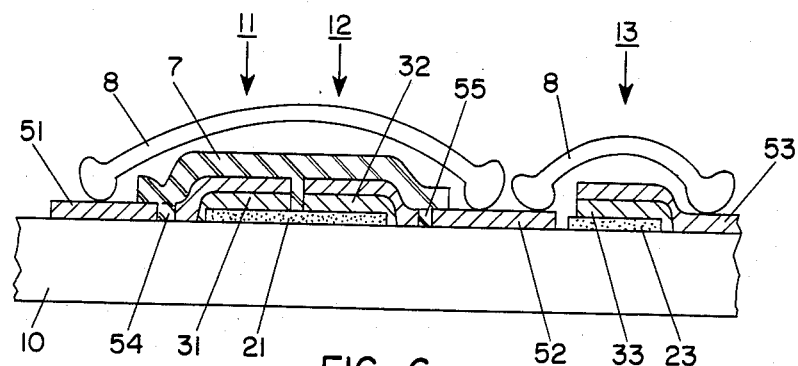
FIG. 6 is a sectional view of image sensor array shown in FIG. 5 in the finished condition.

FIGS. 5 and 6 illustrate an embodiment in which the array of sensor elements includes three rows 11, 12 and 13 of elements. The row 13 is formed on a transparent electrode 23 which is a branch of the transparent electrode 21. With this arrangement, if the sensor element 31 in the row of elements 11 is found to be defective, laser beam separation of that element is effected in the region 54. In addition, a test is also conducted on the sensing element 32 which is adjacent to the element 31 in the row of element 12. If that element is also found to be defective, a test is conducted on the adjacent sensor element 33 in the other row 13 of sensor elements. If that element is found to be operative, the metal electrode 52 is severed by a laser beam in the region 55 as shown in FIG. 6 and the sensing elements 31 and 32 are coated with an insulating film 7.

Thereafter, the output lead 53 of the sensing element 33 is connected to the output lead 51 through two lead wires 8 and the severed output lead 52. In this way, a photocurrent signal from the sensing element 33 in the row of sensor elements 13 can be used in place of a signal from the inoperative sensing element 31 in the row of sensor elements 11. In FIG. 6 an insulating film 7 is not shown on the sensing element 33, but it is desirable to provide one in order to avoid any risk of contact between the lead wire 8 and the adjacent sensing element in the same row of sensors.

With conventional sensor arrays consisting of a single row of elements, if one of 1728 sensor elements required for imaging A4 size sheets is consistently found to be defective, the failure rate in terms of the sensor elements is only 0.06%. Nevertheless, since the entire row normally must be replaced, the effective failure rate is 100%. However, with sensor arrays containing two adjacent rows of elements in accordance with this invention, the effective failure rate, assuming one of every 1728 sensor elements is defective, is only $3.3 \times 10^{-5}$%, which is equal to the probability of both of the corresponding sensor elements in adjacent rows being defective. In other words, the failure rate of closely spaced image sensor arrays can be reduced by more than 99% in accordance with the invention. Moreover, the invention is not limited to image sensor arrays having elements using the a-Si layers. The invention may also be used with arrays having sensor elements using a photoelectric conversion layer or a photoconductive layer consisting of a thin film such as CdS in place of an a-Si layer.

We claim:

1. A line image sensor which involves the scanning of an image line by line photosensor elements which are aligned in rows and which compensate for defective elements by redundancy comprising at least first and second parallel rows of closely spaced photosensor elements, corresponding elements of the rows being in registry, a plurality of separate output leads, a different one common to each set of corresponding elements of the rows, and means for focusing a line image being scanned on each of the rows in succession, whereby an output signal is available at each output lead if any element to which it is connected is operative.

2. A line image sensor in accordance with claim 1 in which there are two parallel rows of photosensor elements and each row comprises an elongated first electrode, an overlying layer of photosensitive material, and a succession of second electrodes overlying the layer, the corresponding electrodes of the succession being in registry for each row, a separate lead to each of the second electrodes, and a separate output lead connected to the first-mentioned leads of each pair of corresponding electrodes, and the first-mentioned lead of any defective element being severed.

3. A sensor in accordance with claim 1 which comprises three parallel rows of closely spaced elements with corresponding elements of each row being in registry.

* * * * *

UNITED STATES PATENT AND TRADEMARK OFFICE
CERTIFICATE OF CORRECTION

PATENT NO. : 4,659,920
DATED : April 21, 1987
INVENTOR(S) : Nishiura et al.

It is certified that error appears in the above-identified patent and that said Letters Patent is hereby corrected as shown below:

First page, Item 54, AND Col. 1, first line, before "IMAGE" insert --CLOSELY SPACED--;
First page, at end of Item 73, insert --and FUJI ELECTRIC CORPORATE RESEARCH AND DEVELOPMENT LTD., Kawasaki, Japan--;
Column 2, line 10, after "the" insert --line--;
Column 3, line 61, "Fig. 31" should read --Fig. 1--;
Column 3, line 63, after "shown" insert --for--;
Column 4, lines 14-15, "showing" should read --shown--.

Signed and Sealed this

Sixth Day of October, 1987

Attest:

DONALD J. QUIGG

*Attesting Officer*

*Commissioner of Patents and Trademarks*